(12) United States Patent
Atkinson et al.

(10) Patent No.: US 6,785,518 B2
(45) Date of Patent: Aug. 31, 2004

(54) TRANSMITTER AND RECEIVER CIRCUIT FOR RADIO FREQUENCY SIGNALS

(75) Inventors: Simon Atkinson, Heathfield (GB); Jonathan R. Strange, Reigate (GB); Robert J. Broughton, Derry, NH (US); Alexander Shvarts, deceased, late of Arlington, MA (US), by Tanya Bulkoushteyn, legal representative

(73) Assignee: Analog Devices, Inc., Norwood, MA (US)

( * ) Notice: Subject to any disclaimer, the term of this patent is extended or adjusted under 35 U.S.C. 154(b) by 351 days.

(21) Appl. No.: 10/077,286

(22) Filed: Feb. 15, 2002

(65) Prior Publication Data

US 2002/0164961 A1 Nov. 7, 2002

Related U.S. Application Data

(60) Provisional application No. 60/269,493, filed on Feb. 16, 2001.

(51) Int. Cl.[7] .............................................. H04M 1/38
(52) U.S. Cl. ........................................ 455/86; 375/308
(58) Field of Search ............................. 455/84, 85, 86, 455/76, 112, 552.1, 553.1; 375/306, 308; 331/2, 14, 16

(56) References Cited

U.S. PATENT DOCUMENTS

| | | | |
|---|---|---|---|
| 3,958,186 A | 5/1976 | Jesse et al. ..................... 331/4 |
| 5,130,670 A | 7/1992 | Jaffe ............................... 331/2 |
| 5,130,676 A | 7/1992 | Mutz ........................... 332/100 |
| 5,313,173 A | 5/1994 | Lampe ......................... 332/103 |
| 5,828,955 A | 10/1998 | Lipowski et al. |
| 5,909,149 A | * 6/1999 | Bath et al. ...................... 331/2 |
| 5,960,364 A | 9/1999 | Dent |
| 5,966,055 A | 10/1999 | Knoedl, Jr. et al. ......... 332/103 |
| 6,157,271 A | 12/2000 | Black et al. ................. 332/127 |
| 6,560,297 B1 | * 5/2003 | Broughton ................... 375/308 |
| 6,574,462 B1 | * 6/2003 | Strange ....................... 455/318 |

FOREIGN PATENT DOCUMENTS

| | | |
|---|---|---|
| DE | 197 43 207 | 9/1997 |
| DE | 905 878 | 9/1998 |
| GB | 905879 | 9/1962 |
| WO | WO 95/16304 | 6/1995 |
| WO | WO 00/52840 | 9/2000 |

* cited by examiner

Primary Examiner—Vivian Chin
Assistant Examiner—Sanh D. Phu
(74) Attorney, Agent, or Firm—Gauthier & Connors LLP

(57) ABSTRACT

A transceiver circuit is disclosed for use in radio frequency communication systems. The circuit includes a transmitter circuit, a receiver circuit and a local oscillator circuit. The local oscillator circuit includes at least one oscillator input signal having a frequency that is a non-integer multiple of the transmission frequency of the radio frequency communication system. The oscillator input signal is used to produce a transmitter local oscillator signal and a receiver local oscillator signal.

18 Claims, 3 Drawing Sheets

TRANSMITTER AND RECEIVER CIRCUIT FOR RADIO FREQUENCY SIGNALS

PRIORITY INFORMATION

The present application claims priority to U.S. Provisional Patent Application Ser. No. 60/269,493 filed on Feb. 16, 2001.

BACKGROUND OF THE INVENTION

The invention relates to the field of transmitters and receivers for radio frequency communication systems, and particularly relates to combined circuits for transmitting and receiving radio frequency (RF) signals.

As wireless communication systems have become increasingly popular, a demand has developed for less expensive yet spectrally clean RF transmitters. High quality RF transmitters typically include relatively expensive components. For example, certain bandpass filters, such as surface acoustic wave (SAW) filters provide excellent performance yet are relatively expensive. Many applications further require transmitters that exhibit low power consumption. It is also desirable that transmitters be suitable for use with any of a plurality of standards for modulation, e.g., global system for mobile communication (GSM) or digital cellular system (DCS).

It is conventionally known that transmitter circuits should be designed to reduce the possibility of spurious signals (e.g., harmonics as well as foreign signals) being introduced into the system. In certain situations, the origin of some spurious signals may be extremely difficult to predict, and may be nearly impossible to simulate. To address this problem, it is generally believed that conventional transmitter circuits should be designed to be flexible so that the frequency plan may be adjusted to remove any noise from the band of interest.

For example, in certain situations, a circuit may be most easily corrected by employing two separate oscillators that facilitate adjustment for reducing noise since either may be adjusted independent of the other. Moreover, the frequencies may be chosen so as to not be harmonically related, which minimizes the chance of harmonic spurious signals being produced by the oscillators. Unfortunately, however, some oscillators are rather expensive. For example, certain oscillator circuits that are formed of synthesizers produce very stable output signals, but are relatively expensive. It is also desirable that the use of relatively expensive filters be avoided.

There is a need, therefore, for inexpensive yet efficient RF transmitters. There is further a need for a translation loop modulator that is spectrally efficient yet economical to produce.

RF receivers generally either convert an input RF signal to an intermediate frequency (e.g., a superheterodyne receiver), or directly mix an input signal to a direct current (DC) signal (e.g., a direct conversion receiver). A direct conversion receiver mixes directly to a DC signal, and is sometimes referred to as a zero IF receiver because the intermediate frequency is zero Hertz (DC). The modulation information only is represented in the down conversion, and there is no carrier information that is typically associated with an intermediate frequency. In a direct conversion receiver the local oscillator signal is operating at the same frequency as the input RF signal. U.S. Pat. Nos. 5,438,692 and 5,548,068 disclose conventional direct conversion receivers.

In direct conversion, the modulation information is preserved through quadrature down conversion, which involves mixing the incoming line or carrier with a local oscillator signal along two different paths. The local oscillator signal along one path may be at zero phase (0°) with respect to the input RF signal, and may be phase shifted to 90° along the other path. Alternatively, one path may be at −45° while the other is at +45° with respect to the input signal. See for example, U.S. Pat. No. 5,303,417. In any event, the circuit paths are typically mutually 90° different in phase, and one path is referred to as the I channel while the other is referred to as the Q channel. The quadrature down conversion method preserves the necessary phase information within the input signal.

Interference may occur if the local oscillator signal radiates to the input RF signal. Because the frequencies of these signals are the same, the local oscillator signal cannot be frequency filtered from the incoming signal. The incoming signal would, in effect, be blocked. U.S. Pat. Nos. 4,811,425 and 5,428,837 are directed to reducing the effects of leakage of local oscillator signals to RF input signals in zero IF receivers.

Moreover, interference may occur if the RF input signal radiates to the voltage controlled oscillator (VCO). Since VCOs are typically very sensitive, any signal that is close in frequency to the frequency of the VCO may interact with it, even if the signal comprises only a small amount of energy. This is because the VCO will selectively amplify signals that are close in frequency to the VCO signal, causing spurious responses.

One way of overcoming this problem is to employ a VCO that operates at a frequency different than the input RF signal. The frequency of the VCO signal is then modified to produce a local oscillator signal at the same frequency as the input RF signal. For example, the signal from one VCO (at frequency $F_1$) may be combined with the signal from another VCO (at frequency $F_2$) by a mixer. The combined signal may then be filtered by a bandpass filter to produce a local oscillator signal. The product, however, of the $F_1$ and $F_2$ signals, will include spurious signals that must be filtered out to produce a spectrally clean local oscillator signal. For example, the product of two sine functions $\sin(\alpha) \times \sin(\beta)$ equals $\frac{1}{2}\cos(\alpha-\beta) - \frac{1}{2}\cos(\alpha+\beta)$. Two frequencies would be produced at the mixer $(F_1+F_2)$ and $(F_1-F_2)$, and one would have to be filtered out. It is typically necessary to do this type of filtering off IC, which further invites interference or leakage of the local oscillator signal to the input RF signal.

In other conventional local oscillator circuits, one VCO only might be employed and the output of the VCO would be input to a frequency doubler, and then to a filter. The frequency of the VCO $(F_1)$ could be one half the frequency of the RF input signal, and the frequency of the local oscillator would then be $2F_1$. In further conventional local oscillator circuits, the frequency of the VCO $(F_1)$ could be twice the frequency of the RF input signal, and the frequency of the local oscillator signal may be equal to $\frac{1}{2}F_1$. This could also be achieved with one VCO $(F_1)$, whose output could be input to a divide-by-two circuit to produce the local oscillator signal. In each such circuit however, the local oscillator signal may still radiate to the RF input signal, and the VCO may be sensitive to harmonic frequencies of the RF input signal.

Such conventional techniques do not fully alleviate the interference problems. It is a further object of the present invention to provide a direct conversion receiver or transmitter that has reduced leakage or interference between the radio frequency input signal and the local oscillator.

It is also an object of the invention to provide an improved RF transmitter and receiver in a single system that achieves the above objectives.

SUMMARY OF THE INVENTION

The invention provides transceiver circuit for use in radio frequency communication systems. The circuit includes a transmitter circuit, a receiver circuit and a local oscillator circuit. The local oscillator circuit includes at least one oscillator input signal having a frequency that is a non-integer multiple of the transmission frequency of the radio frequency communication system. The oscillator input signal is used to produce a transmitter local oscillator signal and a receiver local oscillator signal. In an embodiment, the frequency of two bands of a dual band radio frequency input signal ($F_{RF}$) are provided by the modulus of the product of the frequency of the local oscillator ($F_{LO}$) multiplied by the sum of a non-integer value (1/x) plus or minus one respectively.

BRIEF DESCRIPTION OF THE DRAWINGS

The following detailed description may be further understood with reference to the accompanying drawings in which.

DETAILED DESCRIPTION OF THE INVENTION

Figure 1:
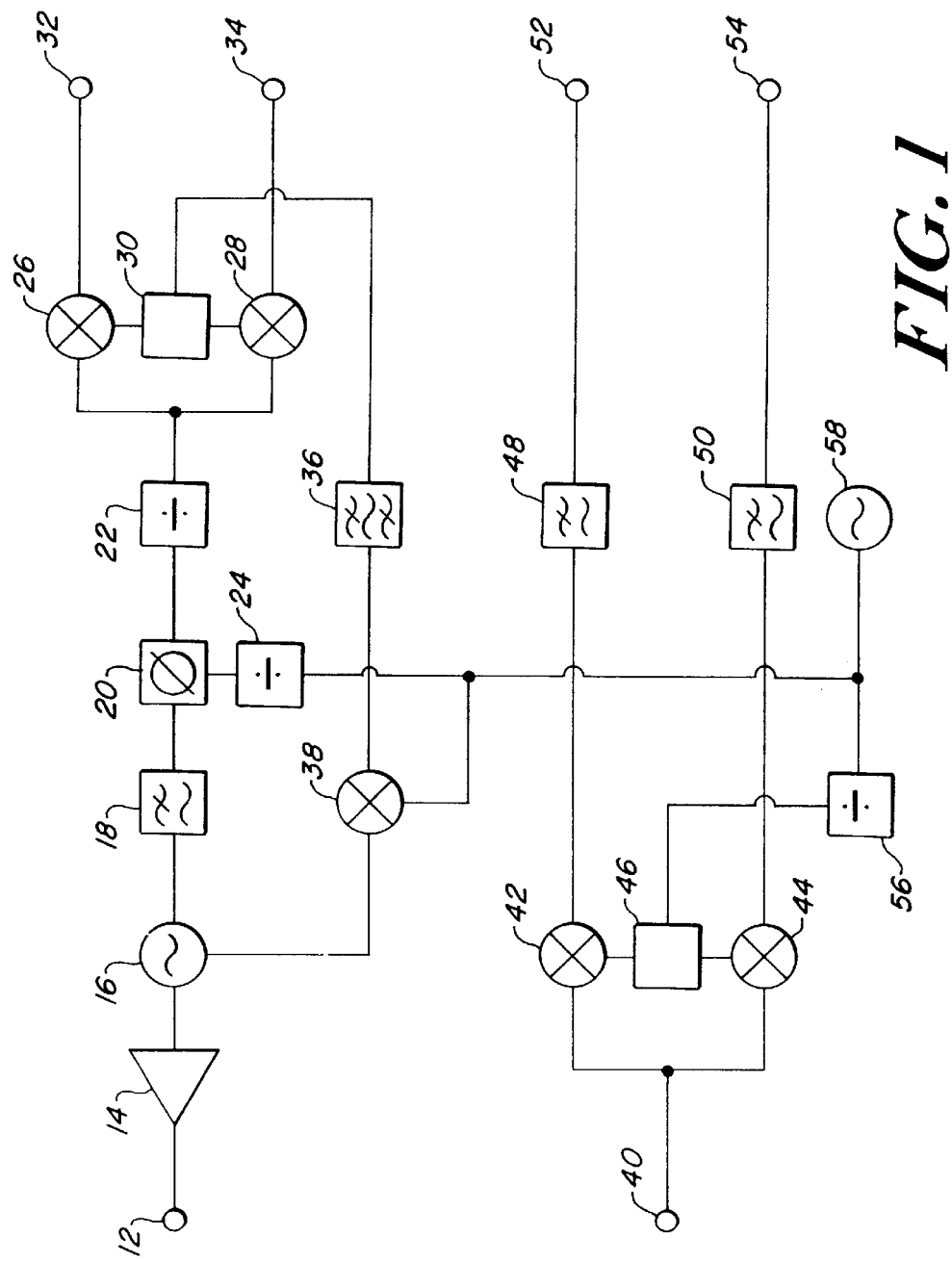
FIG. 1 shows a functional block diagram of an embodiment of a circuit of the invention.

As shown in FIG. 1, a combined transmitter and receiver circuit 10 in accordance with an embodiment of the invention includes a transmitter output port 12 for sending a signal to an antenna following amplification by an amplifier 14. The transmitter circuit includes a VCO 16, a low pass filter 18, a phase sensitive detector 20, and a divider 22 (which in an embodiment performs a divide by two function). The second input signal to the phase sensitive detector 20 is from the output of a frequency divider 24, the input of which is received from a VCO 58. The input to the divider 22 is a quadrature signal that is provided by mixers 26 and 28 that are coupled to inputs 32 and 34. The quadrature phase shift is provided by phase shift device 30. The local oscillator signal is provided by the loop path from the VCO 16 to a mixer 38 and a bandpass filter 36.

As further shown in FIG. 1, the same VCO 58 is used for the receiver circuit. In particular, the VCO 58 is passed through frequency divider 56, and input to a phase shift device 46, which provides quadrature phase shift for the mixers 42 and 44, which receive the input signal at 40. The output of the mixers 42 and 44 are provided to low pass filters 48 and 50, which in turn provide the signals to system receiver ports 52 and 54.

In an embodiment, the VCO 58 may operate at 1350 MHz., and the frequency divider may be switchable between operating as a 2/3 multiplier or a 4/3 multiplier as desired, providing a local oscillator signal for the receiver circuit of either 900 MHz. or 1800 MHz. as desired for the receiver. With regard to the transmitter, the divider 22 may perform a divide by two function, and the divider 24 may perform a divide by six function, providing a transmit signal of either 1800 MHz. or 900 MHz. as desired. In an embodiment, the local oscillator signal may be switchable between 1800 MHz. and 900 MHz. by employing either multi stage dividers from which a divide by two function may be obtained, or by employing a selectable further divide by two divider in the path to the antenna 14. The system permits a single VCO to be used for both the transmitter and receiver circuits, and reduces the chances of noise due to harmonic interference since the VCO frequency is not an integer multiple of either 1800 MHz. or 900 MHz.

Figure 2:
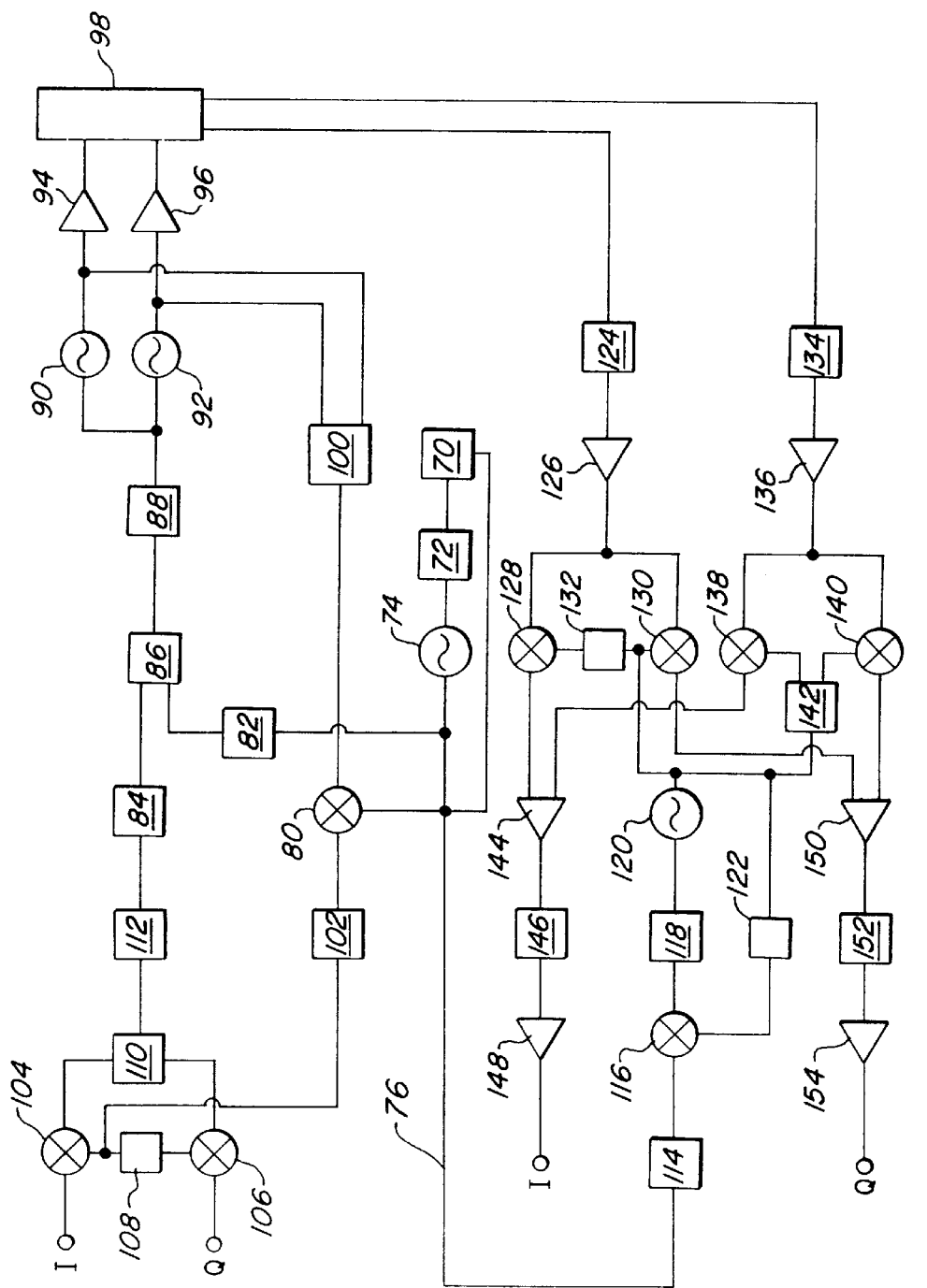
FIG. 2 shows a functional block diagram of another embodiment of a circuit of the invention.

As shown in FIG. 2, a combined transmitter and receiver circuit including a translation loop modulator of the invention includes a fractional n synthesizer 70, a low pass loop filter 72 and a VCO 74, the output of which is a local oscillator signal 76. The local oscillator signal 76 is fed back to the fractional n synthesizer, is input to a downconverter mixer 80 in a feedback path of the transmitter circuit, and is input to an n frequency divider 82 of a phase comparitor portion as shown. The phase comparitor portion also includes an m frequency divider 84, a phase comparitor and charge pump device 86, and a lowpass filter 88.

The output of the filter 88 is coupled to a pair of VCOs 90 and 92, each of which is in turn coupled to an amplifier 94 and 96 respectively, and finally an output antenna 98. The transmitter output may be switched between each output path to provide operation at of two transmission standards. The two chosen transmission standards may be any of a variety of standards, e.g., GSM and DCS. In other embodiments, the system may accommodate any number of operating modes.

The feedback path includes a matching or switching device that alternately receives input signals from the output of one or the other of the VCOs 90 or 92. The output of the combiner device 100 is presented as in input to the downconverter mixer 80. The output of the mixer 80 is coupled, via a bandpass filter 102, to the quadrature modulator components as a feedback signal. The quadrature modulator components include I and Q channel mixers 104, 106, a phase shift device 108, a summation device 110, and bandpass filter 112 as shown.

The local oscillator output signal 76 of the system is also fed to a receiver circuit in the system of FIG. 2. In particular, the local oscillator signal 76 is coupled, via a frequency divider 114 (e.g., divide by 3), to an oscillator loop including a mixer 116, another frequency divider 122 (e.g., divide by 4), a VCO 120, and a low pass loop filter 118. The output of the VCO 120 is also coupled to each of two signal receive paths, e.g., one for GSM and the other for DCS systems.

The first signal receive path from the antenna 98 is coupled, via a bandpass filter 124 (e.g., SAW) and an amplifier 126 to a quadrature demodulation circuit including a pair of mixers 128 and 130, as well as a phase shift device 132 which provides, for example, a zero and a 90 degrees phase shift of the VCO 120 oscillator signal. The other signal path from the antenna 98 similarly includes a bandpass filter 134 (e.g., SAW) and an amplifier 136 in communication with a pair of mixers 138 and 140. The quadrature components of the second signal path include a frequency divider 142 (e.g., divide by 2) which provides the VCO 120 oscillator signal with a frequency divided by 2 to each mixer 138 and 140.

The outputs of mixers 128 and 138 are presented to a selection device 144, which is coupled via a low pass filter 146 to an amplifier 148 to provide the I channel receiver output. The output of mixers 130 and 140 are presented to a selection device 150, which is coupled via a low pass filter 152 to an amplifier 154 to provide the Q channel receiver output. In certain embodiments, the selection device 144 (as well as the device 150) may simply comprise a node that joins the input lines together with the output line.

During operation, the reference signal produced by the oscillator 74 is provided to the phase comparator circuitry of the transmitter, to the down converter mixer of the transmitter, and to the frequency divider 114 of the receiver circuitry. The reference signal is used by a loop oscillator circuit to provide a receiver reference signal for the quadrature demodulators of the receiver circuitry. The receive reference signal is used with zero and 90 degrees phase shift to produce the I and Q channel signals for DCS band, and is used with the frequency divider to produce the I and Q channel signals for GSM band.

The local oscillator signal that is input to the downconverter mixer is also input to the n frequency divider. In an embodiment, this signal is produced by a fractional n synthesizer, a loop filter and a VCO, all of which are connected in a feedback loop configuration. Specifically, the output of the fractional n synthesizer is coupled via the low pass filter to the VCO. The output of the VCO produces the local oscillator signal, and this output signal is fed back to the fractional n synthesizer. The invention provides, therefore, that one VCO only may provide an oscillator signal to both the phase comparator circuitry and to the downconverter mixer in the feedback circuitry. This is achieved through careful selection of components.

The circuit provides that the frequency of the transmitter output signal ($RF_{OUT}$) may be related to the frequency of the local oscillator. In particular, we are concerned with the high side and low side products of the mixer, and because it's a downconverter, we are concerned with the difference product IF=|RF−LO|. For GSM, therefore, $RF_{LO}/n=(RF_{LO}-RF_{OUT})/m$, where $RF_{LO}-RF_{OUT}$ is the high side difference product. Solving for $RF_{OUT}$, $RF_{OUT}=RF_{LO}(1-m/n)$ which provides that $RF_{LO}=RF_{OUT}/(1-m/n)$. For DCS, $RF_{LO}/n=(RF_{OUT}-RF_{LO})/m$, where $RF_{OUT}-RF_{LO}$ is the low side difference product. Solving for $RF_{OUT}$, $RF_{OUT}=RF_{LO}(1+m/n)$ or $RF_{LO}=RF_{OUT}/(1+m/n)$. The values of m and n may be chosen such that the transmitter output signal may be at 900 MHz for GSM, and may be at 1800 MHz for DCS. This may be achieved by recognizing that $RF_{OUT}=RF_{LO}+RF_{IF}$ for DCS and $RF_{OUT}=RF_{LO}-RF_{IF}$ for GSM where $RF_{IF}$ is the frequency of the intermediate frequency signal, which is the feedback signal to the quadrature modulator. In various embodiments, the local oscillator may include a voltage controlled oscillator in series with a variable frequency multiplier (1/A), e.g., $RF_{LO}=RF_{VCO}/A$.

During operation, the output of the phase comparator provides a dc voltage responsive to the phase difference between two input signals of the same frequency. For example, the input signals to the phase comparator may each be 225 MHz in frequency. If m=2 and n=6, then the signal input to the m frequency divider must be 450 MHz in frequency, and the signal input to the n frequency divider must be 1350 MHz. For GSM, the output signal produced by the transmit oscillator will be 900 MHz in frequency. This signal is output to the transmitter antenna (not shown). For these values of m and n, therefore, $RF_{LO}=3/2RF_{OUT}$ for GSM, $RF_{LO}=3/4RF_{OUT}$ for DCS.

The output signal is also coupled to the downconverter mixer as the R input. The local oscillator input signal will be at a frequency of 1350 MHz. Since a mixer will produce signals having frequencies at the sum as well as at the difference between the frequencies of the two input signals, the output of the mixer produces two signals, one having a frequency of 2250 MHz, and another having a frequency of 450 MHz. For example, the product of two sine functions $\sin(\alpha) \times \sin(\beta)$ equals $\frac{1}{2} \cos(\alpha-\beta) - \frac{1}{2} \cos(\alpha+\beta)$. The two frequencies produced at the output therefore would be $F_1+F_2$ and $F_1-F_2$. The 2250 MHz signal is filtered out at the filter, and the quadrature modulator circuit receives a feedback signal at 450 MHz.

By controlling I and Q, the phase (or angle) of the 450 MHz signal that is input to the m divider may be precisely controlled. For example, if zero volts is applied on the Q input and one volt is applied to the I input, then the signal provided to the divider circuitry would be a 450 MHz signal at zero degrees. If zero volts is applied on the Q input and negative one volt on the I input, then the quadrature output signal would be a 450 MHz signal at 180 degrees. If one volt is applied on the Q input and zero volts on I input, then the output signal would be a 450 MHz signal at 90 degrees. If negative one volt is applied on the Q input and zero volts is applied to the I input, then the output signal would be a 450 MHz signal at −90 degrees. By adjusting the I and Q inputs, the angle of the 450 MHz signal may be fully adjusted.

The quadrature modulator therefore provides the modulation for the RF output signal. The output of the phase comparitor produces a signal at the frequency of the sum of the inputs, as well as a signal at a frequency of the difference between the inputs. The signal at the sum frequency (450 MHz) is filtered out at the filter, and the dc signal (zero MHz.) is input to the voltage controlled oscillator, which in turn, produces the output signal for the antenna. The filter also, among other functions, filters any other noise that may develop in the system.

With proper selection of the VCO, the filters, and the values of the frequency dividers, a translation loop modulator circuit may be provided that achieves the objectives of the invention. In other embodiments, the values of m and n may be different. The invention permits the elimination of one oscillator in a translation loop modulator circuit without significant degradation of performance characteristics.

Figure 3:
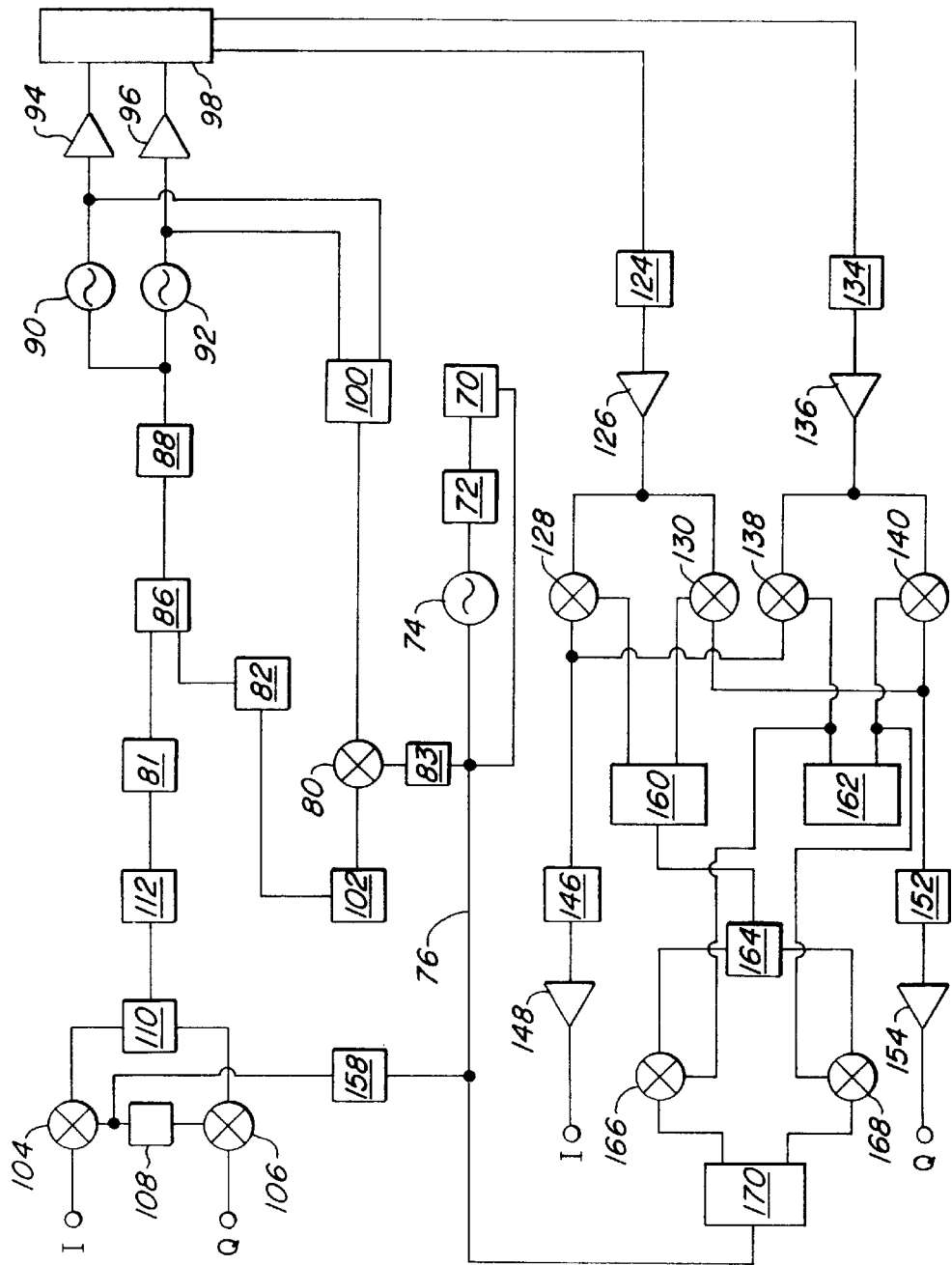
FIG. 3 shows a functional block diagram of a further embodiment of a circuit of the invention.

As shown in FIG. 3, a further embodiment of the invention provides a transceiver circuit similar to that shown in FIG. 2 except that output of the mixer 80 is coupled via the bandpass filter 102 to the frequency divider 82, rather than the output of the VCO 74 being coupled to the frequency divider 82 as in FIG. 2. The input from the local oscillator circuit is also passed through a frequency divider 83. Further, the feedback signal to the quadrature channel mixer 104 and the phase shift device 108 is coupled to the local oscillator signal 76 via a frequency divider 158 as shown in FIG. 3 rather than being coupled to the filter 102 as in FIG. 2. In an embodiment, the frequency dividers 82, 84 and 83 provide the same division value, e.g., y, and the divider 158 provides a different division value, e.g., x.

The receiver circuit in FIG. 3 is also similar to that shown in FIG. 2, except that the pair of mixers 128 and 130 are coupled to a frequency divider 160, and the mixers 138 and 140 are coupled to the output of a frequency divider 162. The output of the divider 160 is coupled to the divider 162, and the input of divider 160 is coupled to a summation device 164. The input of the summation device 164 is coupled to a pair of mixers 166 and 168. The mixers 138 and 140 are also coupled to the mixers 166 and 168 as shown, and the outputs of the mixers 166 and 168 are coupled to a summation device 170, which is coupled to the local oscillator signal 76 as shown in FIG. 3.

During operation the frequency divider 158 may provide a frequency multiplication of ⅙ and the frequency dividers 82, 83 and 84 may each provide a frequency multiplication of ½ in accordance with an embodiment of the invention. The frequency dividers 160 and 162 in the receiver circuit may also each provide a frequency multiplication of ½. The local oscillator signal 76 in this configuration provides a signal frequency of 2.7 GHz. The feedback signal to the transmitter input quadrature mixers, therefore is 450 MHz., the signals that is input to the frequency divider 84 is 450

MHz and the signal that is output from the frequency divider 84 is 225 MHz. The other signal that is input to the comparator 86 is also 225 MHz, so the signal that is input to the frequency divide 82 is 450 MHz. The feedback circuit is at either 1800 MHz. or 900 MHz depending on the mode of operation, and the mixer 80 combines this signal with the a signal at 1350 MHz that is output from the frequency divider 83. The output of the mixer 80 is at 450 MHz. and this signal is provided to the frequency divider 82 after passing through the filter 102.

In the receiver circuit, the reference signal (at 2.7 GHz) is provided input to summation device 170 of an image rejection mixer. The mixers combine the quadrature components of this signal with 900 MHz signals from the mixers 138 and 140. The outputs of the mixers 166 and 168 are provided to the summation device 164, and the output signal of the device 164 is therefore at 3.6 GHz. This signal is then input to the frequency divider 160 to provide a 1.8 GHz. signal for the mixers 128 and 130 as shown. The frequency divider 160 also provides a 1.8 GHz output signal to the frequency divider 162, and the output of the frequency divider 162 (which is at 900 MHz.) is provided to the mixers 138 and 140, and is provided to the mixers 166 and 168 as shown.

The circuit of FIG. 3, therefore, permits a single local oscillator to be used in a dual band radio frequency transceiver in which the local oscillator signal is a non-integer harmonic of the radio frequency signals.

Those skilled in the art will appreciate that numerous modifications and variations may be made to the above disclosed embodiments without departing from the spirit and scope of the invention.

What is claimed is:

1. A radio frequency transceiver for transmitting and receiving radio frequency signals, said transceiver comprising a transmitter circuit, a receiver circuit and a local oscillator circuit:

said transmitter circuit that is coupled to a transceiver reference signal for transmitting quadrature related radio frequency signals, said transmitter circuit including (a) input means for receiving an input signal that is representative of information to be modulated and for producing an intermediate signal, (b) comparator means for receiving said intermediate signal and a comparator reference signal, and for producing a comparator output signal responsive to said intermediate signal and said comparator reference signal, and (c) feedback circuitry coupled to said comparator output signal for producing a feedback signal that is coupled to said input means, said feedback circuitry including a feedback mixer that is coupled to a feedback reference signal having a frequency of about 1350 MHz;

said receiver circuit for receiving quadrature related radio frequency signals and being coupled to said transceiver reference signal; and said local oscillator circuit for producing said transceiver reference signal for said transmitter circuit and said receiver circuit.

2. The transceiver as claimed in claim 1, wherein said input means includes a pair of quadrature related mixers and a bandpass filter.

3. The transceiver as claimed in claim 1, wherein said comparator means includes a pair of frequency dividers, a phase comparator coupled to the frequency dividers, a lowpass filter, and a pair of voltage controlled oscillators.

4. The transceiver as claimed in claim 3, wherein said comparator means further includes a bandpass filter that is coupled to one of said frequency dividers.

5. The transceiver as claimed in claim 1, wherein said feedback means includes a mixer and a bandpass filter.

6. The transceiver as claimed in claim 1, wherein said feedback means includes a mixer and a frequency divider.

7. A radio frequency transceiver for transmitting and receiving radio frequency signals having a frequency $F_{RF}$, said transceiver comprising a transmitter circuit, a receiver circuit and a local oscillator circuit:

said transmitter circuit for transmitting quadrature related radio frequency signals, said transmitter circuit including frequency multiplication means for providing a 1/x frequency multiplication of a local oscillator signal;

said receiver circuit for receiving quadrature related radio frequency signals and being coupled to said local oscillator signal; and said local oscillator circuit for producing said local oscillator signal for said transmitter circuit and for said receiver circuit, said local oscillator signal having a frequency $F_{LO}$ where $F_{RF}=F_{LO}(1/x+1)$ in a first frequency band of operation of said transceiver, and $F_{RF}=F_{LO}(1/x-1)$ in a second frequency band of operation of said transceiver.

8. The transceiver as claimed in claim 7, wherein said frequency multiplication means includes a phase comparator that is coupled to a divide by two frequency divider and a divide by six frequency divider, the divide by six frequency divider being also coupled to said local oscillator circuit.

9. The transceiver as claimed in claim 7, wherein said frequency multiplication means includes a divide by six frequency divider that is coupled to said local oscillator circuit and to a quadrature mixer of an input unit to said transmitter circuit.

10. The transceiver as claimed in claim 1, wherein said local oscillator circuit provides a local oscillator signal having a frequency of about 1350 MHz.

11. The transceiver as claimed in claim 1, wherein said local oscillator circuit provides a local oscillator signal having a frequency of about 2.7 GHz.

12. A dual band radio frequency transceiver for transmitting and receiving dual band radio frequency signals, said transceiver comprising:

a transmitter circuit for transmitting quadrature related radio frequency signals having a frequency of $F_{RF}$, said transmitter circuit including a frequency multiplication means providing a 1/x frequency multiplication; and a local oscillator circuit for providing a local oscillator signal at a frequency of $F_{LO}$, where $F_{RF}=F_{LO}(1/x+1)$ in a first operation frequency band, and $F_{RF}=F_{LO}(1/x-1)$ in a second operation frequency band.

13. The transceiver as claimed in claim 12, where said transceiver further includes a receiver circuit that is coupled to said local oscillator signal.

14. The transceiver as claimed in claim 12, wherein said local oscillator signal is provided at 1350 MHz.

15. The transceiver as claimed in claim 12, wherein said local oscillator signal is provided at 2.7 GHz.

16. The transceiver as claimed in claim 12, wherein said value x equals 3.

17. The transceiver as claimed in claim 12, wherein said value x is an integer.

18. The transceiver as claimed in claim 12, wherein said dual band radio frequency signals are at 900 MHz and 1800 MHz.

* * * * *